United States Patent
Paul et al.

(10) Patent No.: US 10,156,597 B2
(45) Date of Patent: Dec. 18, 2018

(54) METHOD AND SYSTEM FOR DETERMINING POWER CONSUMPTION

(71) Applicant: Texas Instruments Incorporated, Dallas, TX (US)

(72) Inventors: Somshubhra Paul, Bangalore (IN); Ameet Suresh Bagwe, Balgalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1396 days.

(21) Appl. No.: 13/861,740

(22) Filed: Apr. 12, 2013

(65) Prior Publication Data
US 2014/0309955 A1    Oct. 16, 2014

(51) Int. Cl.
G01R 21/00 (2006.01)
G01R 21/133 (2006.01)
G05F 1/10 (2006.01)

(52) U.S. Cl.
CPC ........... G01R 21/133 (2013.01); G01R 21/00 (2013.01); G05F 1/10 (2013.01)

(58) Field of Classification Search
CPC ....... G01R 21/133; G01R 22/00; G01R 21/00
USPC .......................................................... 702/61
See application file for complete search history.

(56) References Cited

U.S. PATENT DOCUMENTS

| | | | |
|---|---|---|---|
| 4,082,998 A * | 4/1978 | Marriott | G01R 19/255 324/111 |
| 4,608,530 A * | 8/1986 | Bacrania | G05F 3/262 323/315 |
| 6,798,250 B1 * | 9/2004 | Wile | G01R 19/0092 327/51 |
| 7,379,484 B2 * | 5/2008 | Wang | H01S 5/042 372/29.015 |
| 8,232,781 B2 * | 7/2012 | Marino | G01R 19/16552 323/271 |
| 2003/0151396 A1 * | 8/2003 | Self | G05F 3/262 323/312 |
| 2004/0179257 A1 * | 9/2004 | Gurcan | G02B 26/0841 359/290 |
| 2009/0055672 A1 * | 2/2009 | Burkland | H04L 12/10 713/340 |
| 2011/0084682 A1 * | 4/2011 | Yu | G05F 3/262 323/315 |

* cited by examiner

OTHER PUBLICATIONS

Lin, Chuan, et al., "Design of Current Limiting Circuit in Low Dropout Linear Voltage Regulator". IEEE Microwave Conference Proceedings, 2005. APMC 2005. Asia-Pacific Conference Proceedings, Dec. 4-7, 2005, pp. 1-4, vol. 2, IEEE, Chengdu, China.

*Primary Examiner* — Mischita Henson
*Assistant Examiner* — Christine Liao
(74) *Attorney, Agent, or Firm* — Kenneth Liu; Charles A. Brill; Frank D. Cimino

(57) ABSTRACT

For determining a power consumption of electrical circuitry, at least one device executes at least a portion of a software application having an effect on a current through the electrical circuitry. A current is generated through a transistor for mirroring the current through the electrical circuitry. In response to a control word, a reference current is generated. In response to executing the portion of the software application, the control word is varied to determine a value thereof that causes the reference current to approximately equal the current through the transistor, in a manner that correlates the effect of the portion of the software application on the current through the electrical circuitry.

28 Claims, 2 Drawing Sheets

METHOD AND SYSTEM FOR DETERMINING POWER CONSUMPTION

BACKGROUND

For determining a device's power consumption in real time, a series element (external to the device) may be added at the device's input power pin (e.g., on a circuit board), so that a voltage is measurable across the series element. For example, such voltage could be measurable by a pin grid array ("PGA") in series with an analog-to-digital converter ("ADC"). However, such a measurement technique can increase area by a significant amount, and/or interfere with a human user's ability to accurately identify an internal portion of the device that causes an increase in the device's power consumption.

Moreover, such measurement can be slower (e.g., by many orders of magnitude) than the device's frequency of executing a software application's instructions. Such disparity (between such measurement's frequency and the device's frequency) can interfere with the human user's ability to accurately correlate an effect of the software application on the device's power consumption, unless the device is then-currently executing a relatively tight loop of the software application's instructions. To enhance such correlation, the device may output program counter samples over a trace interface, but the trace interface's operation could interfere (e.g., by multiplexing pins) with the software application's operation.

SUMMARY

For determining a power consumption of electrical circuitry, at least one device executes at least a portion of a software application having an effect on a current through the electrical circuitry. A current is generated through a transistor for mirroring the current through the electrical circuitry. In response to a control word, a reference current is generated. In response to executing the portion of the software application, the control word is varied to determine a value thereof that causes the reference current to approximately equal the current through the transistor, in a manner that correlates the effect of the portion of the software application on the current through the electrical circuitry.

DETAILED DESCRIPTION

Figure 1:
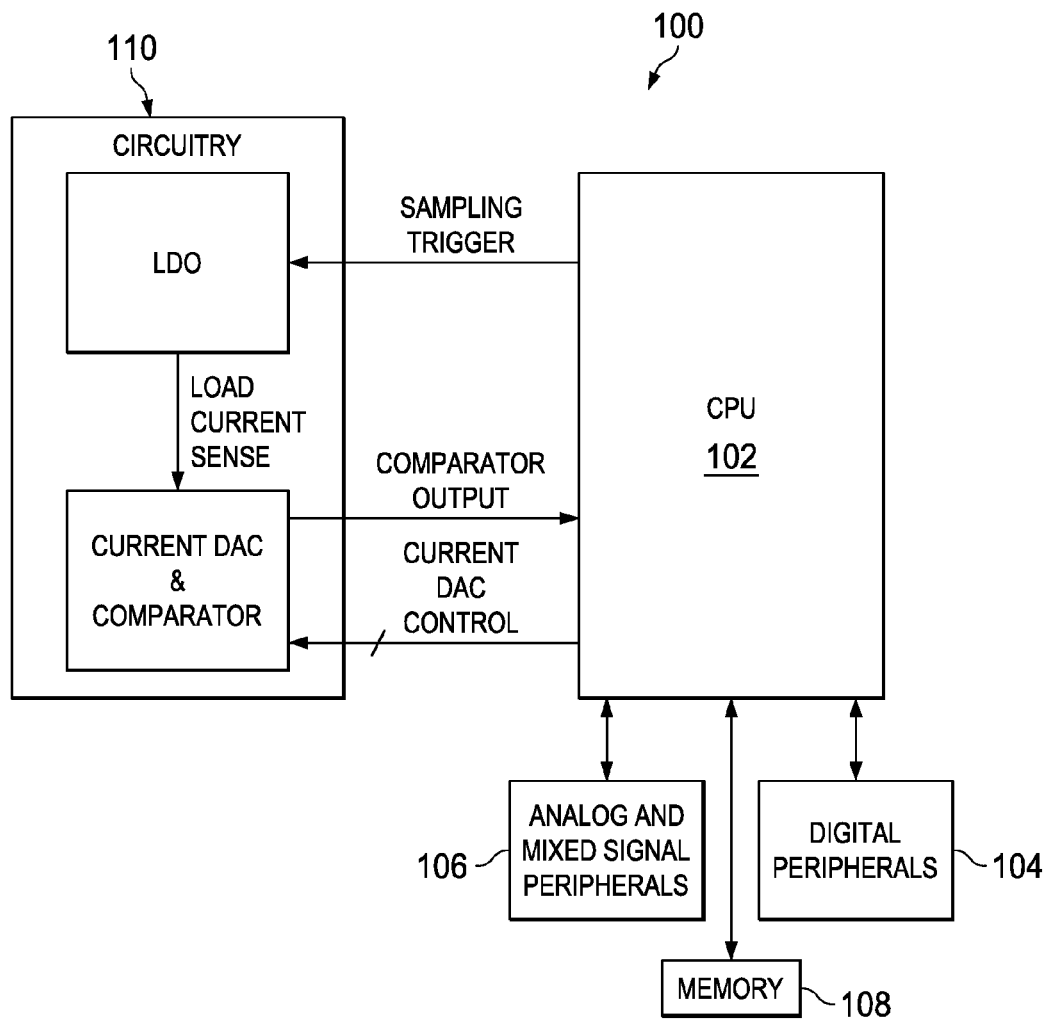
FIG. 1 is a block diagram of an information handling system of the illustrative embodiments.

FIG. 1 is a block diagram of an information handling system (e.g., one or more electronics devices), indicated generally at 100, of the illustrative embodiments. As shown in the example of FIG. 1, a central processing unit ("CPU") 102 is connected to digital peripherals 104, analog and mixed signal peripherals 106, and a memory 108. Also, the CPU 102 is connected to one or more instances of electrical circuitry (collectively, "circuitry instances") 110.

For example, in one embodiment: (a) a first one of the circuitry instances 110 is located within at least one of the peripherals 104 for sensing a current through a portion of such peripheral(s); (b) a second one of the circuitry instances 110 is located within at least one of the peripherals 106 for sensing a current through a portion of such peripheral(s); (c) a third one of the circuitry instances 110 is located within the memory 108 for sensing a current through a portion of the memory 108; and (d) a fourth one of the circuitry instances 110 is located (e.g., integrally formed) within the CPU 102 for sensing a current through a portion of the CPU 102. Each one of the circuitry instances 110 includes: (a) a respective linear low-dropout ("LDO") regulator for sensing a current and outputting a load current sense in response thereto; and (b) a respective current digital-to-analog converter ("DAC") and comparator for determining a level of such load current sense.

To each one of the circuitry instances 110, the CPU 102 outputs: (a) a respective sampling trigger signal; and (b) a respective current DAC control word. From each one of the circuitry instances 110, the CPU 102 receives a respective comparator output signal. In the illustrative embodiments, such control word is an n-bit word, where n is a positive integer.

Figure 2:
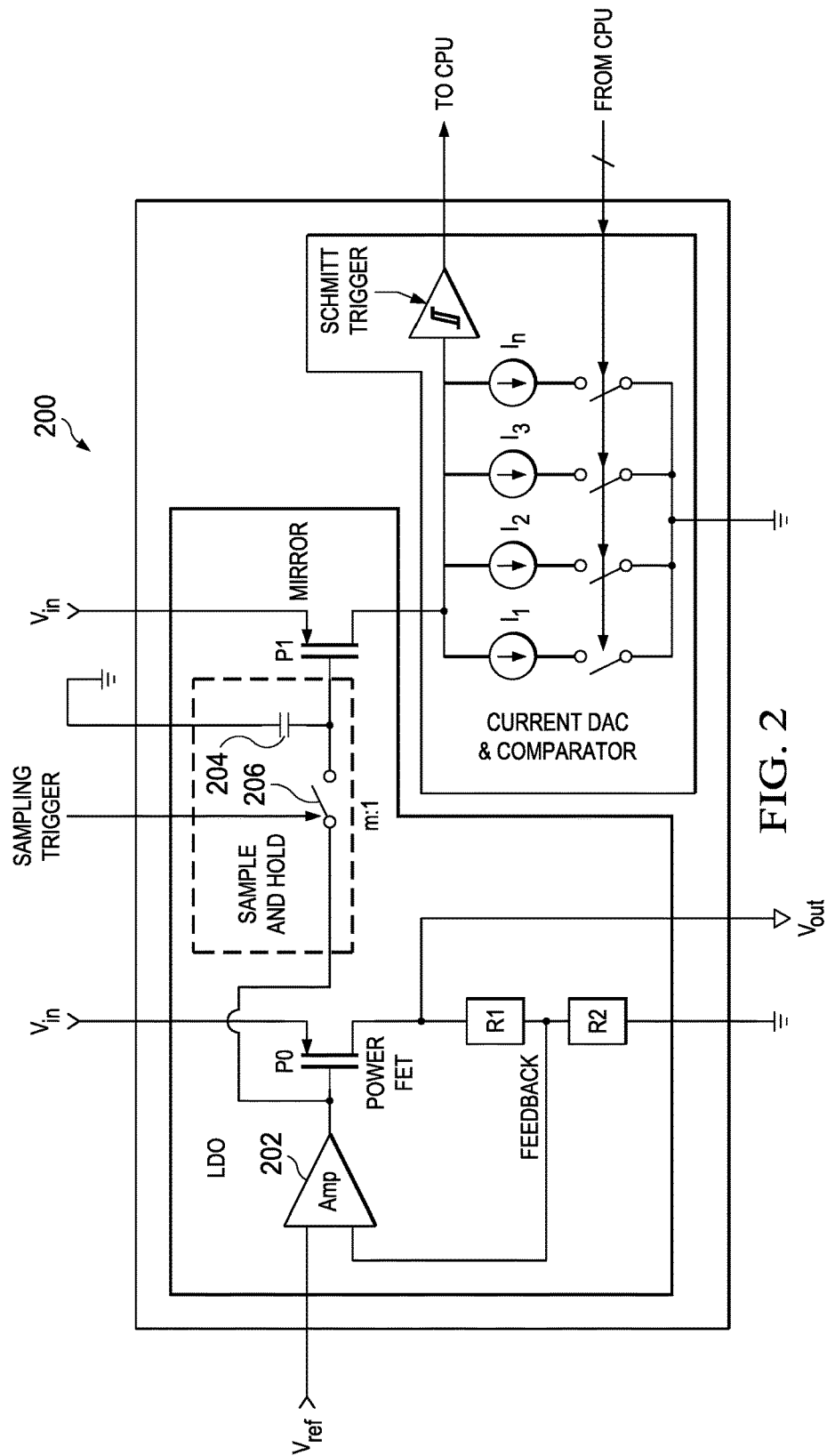
FIG. 2 is an electrical circuitry diagram of a representative circuitry instance of the system of FIG. 1.

FIG. 2 is an electrical circuitry diagram of a representative one of the circuitry instances 110, indicated generally at 200. The representative circuitry instance 200 senses a current through a portion of a device (e.g., a portion of the CPU 102, a portion of the peripherals 104, a portion of the peripherals 106, or a portion of the memory 108), within which the representative circuitry instance 200 is located. From such device, the representative circuitry instance 200 receives a reference voltage signal $V_{ref}$ and an input voltage signal $V_{in}$. To such device, the representative circuitry instance 200 outputs a voltage signal $V_{out}$, which supplies power to at least such portion of such device.

An amplifier 202 has an output node and first and second input nodes. The output node is connected to a gate of a field effect transistor ("FET") P0. The first input node is connected to $V_{ref}$. The second input node is connected between resistors R1 and R2.

A first source/drain of the FET P0 is connected to $V_{in}$. A second source/drain of the FET P0 is coupled to a ground through the resistors R1 and R2 in series, as shown in FIG. 2. Also, $V_{out}$ is connected to the second source/drain of the FET P0.

In response to $V_{ref}$, the amplifier 202 operates to regulate a voltage level of $V_{out} = V_{ref}*(R1+R2)/R2$. For such operation, a voltage level of $V_{in}$ is greater than the voltage level of $V_{out}$ by at least a dropout voltage. Accordingly, the dropout voltage is a difference between: (a) a minimum voltage level of $V_{in}$ for such operation; and (b) the voltage level of $V_{out}$.

A capacitor 204 has: (a) a first node that is connected to a gate of a FET P1; and (b) a second node that is connected to the ground. In the illustrative embodiments, the FET P1 is smaller than the FET P0. A first source/drain of the FET P1 is connected to $V_{in}$. A second source/drain of the FET P1 is connected to: (a) an input node of a Schmitt trigger; and (b) input nodes of parallel binary-weighted current sources $I_1$ through $I_n$, as shown in FIG. 2.

For estimating a current through the FET P0, the CPU 102 outputs the sampling trigger signal in a manner that closes a switch 206, thereby connecting the gate of the FET P0 to the gate of the FET P1, during a time period that is sufficiently long for charging the capacitor 204 to a same then-current voltage level as the gate of the FET P0. After such time period, the CPU 102 ends the sampling trigger signal in a manner that opens the switch 206, thereby disconnecting the gate of the FET P0 from the gate of the FET P1. After the switch 206 opens, the capacitor 204 continues holding its charged voltage level during a time period that is sufficiently long for estimating a current through the FET P1 ("mirroring current"), which mirrors the current through the FET P0 according to a channel width ratio between the FET P1 and the FET P0. In an alternative embodiment, the representative circuitry instance 200 receives the sampling trigger signal from a periodic source (e.g., timer circuitry), instead of receiving the sampling trigger signal from the CPU 102.

For estimating the mirroring current, the representative circuitry instance 200 compares the mirroring current against a reference current. The reference current is generated by the current sources $I_1$ through $I_n$, according to a number of the current sources $I_1$ through $I_n$ that are then-currently enabled by the respective current DAC control word from the CPU 102. For example, in response to the respective current DAC control word from the CPU 102, the representative circuitry instance 200 selectively opens or closes switches for then-currently: (a) connecting such number of the current sources $I_1$ through $I_n$ to the ground, thereby enabling such number of the current sources $I_1$ through $I_n$; and (b) disconnecting a remainder of the current sources $I_1$ through $I_n$ from the ground, thereby disabling such remainder of the current sources $I_1$ through $I_n$.

In response to the reference current rising above a first threshold greater than the mirroring current, the Schmitt trigger changes its output (which is the respective comparator output signal) from a binary 1 logical value to a binary 0 logical value. Conversely, in response to the reference current falling below a second threshold lower than the mirroring current, the Schmitt trigger changes its output from the binary 0 logical value to the binary 1 logical value. In that manner, the representative circuitry instance 200 generates its respective comparator output signal (from the Schmitt trigger's output node) in a relatively clean glitch-free manner.

When the Schmitt trigger changes its output, it thereby indicates that the reference current is approximately equal to the mirroring current. Accordingly, the CPU 102 systematically varies (e.g., by incrementing, decrementing and/or iterating) a value of the respective current DAC control word until the Schmitt trigger changes its output. In response to a triggering value of the respective current DAC control word that causes the Schmitt trigger to change its output, the CPU 102 calculates: (a) the reference current generated in response to the respective current DAC control word; and (b) an estimated current through the FET P0 ("sensed current") as being approximately equal to the reference current multiplied by a channel width ratio between the FET P1 and the FET P0.

In response to the sensed current, the CPU 102 generates other signals for controlling various operations of the system 100 (e.g., by outputting such other signals to the peripherals 104, the peripherals 106 and/or the memory 108). For example, the CPU 102 is operable to output the sensed current for storage (e.g., within the memory 108) and/or display to a human user. In response to the sensed current, the human user may conduct more accurate power profiling (and subsequent power debugging) of the system 100 when developing software applications for execution by the CPU 102.

The CPU 102 performs at least some of its operations (e.g., determining the sensed current) in response to: (a) instructions of computer-readable programs (e.g., software applications), which are stored on a computer-readable medium (e.g., the memory 108, a hard disk drive, a flash memory card, or other nonvolatile storage device); and/or (b) signals from a state machine. The system 100 is formed by electrical circuitry components for performing the system 100 operations, implemented in a suitable combination of software, firmware and hardware, such as one or more digital signal processors ("DSPs"), microprocessors, discrete logic devices, application specific integrated circuits ("ASICs"), and field-programmable gate arrays ("FPGAs"). In a first example, the system 100 is formed within a single integrated circuit. In a second example, the system 100 is formed within a multi-chip module ("MCM").

In one case, when developing a software application for execution by the CPU 102, the human user identifies a point (within the software application) at which the human user wants to correlate an effect of a portion (ending at such point) of the software application on the system 100 power consumption. At such point (within the software application), the human user inserts one or more additional instructions (e.g., a software function call). Accordingly, such additional instruction(s) is/are the last instruction(s) of the portion (ending at such point) whose effect is to be so correlated.

Next, the human user causes the CPU 102 to actually execute the software application (including such additional instructions). During such execution, such additional instructions cause the CPU 102 to: (a) determine the sensed current(s) at one or more of the circuitry instances 110, in a manner that correlates the effect of the portion (ending at such point) of the software application on the sensed current(s); and (b) output the sensed current(s) for storage (e.g., within the memory 108) and/or display to the human user (e.g., as a returned value from the software function call). In response to reviewing the sensed current(s), the human user: (a) correlates the effect of the portion (ending at such point) of the software application on the system 100 power consumption; and (b) in response to such correlation, decides whether and how to revise the software application, and/or hardware component(s) of the system 100, for improving the system 100 power consumption.

By having the CPU 102 execute the software application in that manner, the system 100 determines the sensed current(s) without requiring the CPU 102 to have a specific operating frequency. The sensed current(s) is/are readily associated with such point (within the software application) where such additional instructions were inserted, even if the CPU 102 is not then-currently executing a relatively tight loop of the software application's instructions. Accordingly, the system 100 accurately correlates the effect of the portion (ending at such point) of the software application on the sensed current(s), which increases the user's efficiency in debugging the system 100 during power profiling.

The system 100 determines the sensed current(s) in real time within a single integrated circuit (in a first example) or an MCM (in a second example), while increasing area of such integrated circuit or MCM by only a relatively small amount, and without requiring additional pins, and without requiring additional hardware (e.g., circuitry) external to such integrated circuit or MCM. In the illustrative embodiments, the FET P1's channel width is smaller than the FET P0's channel width (e.g., according to a channel width ratio of 1 to m, where m is a positive number, such as 100 or 1000), so that the FET P1 consumes a relatively small amount of extra power. In the representative circuitry instance 200, the capacitor 204, the FET P1, and the current DAC and comparator are: (a) relatively non-intrusive in the system 100 operation; and (b) accordingly, suitable for inclusion within a final operating version of the system 100, and/or within a prototype (e.g., debug) version of the system 100.

In the illustrative embodiments, a computer program product is an article of manufacture that has: (a) a computer-readable medium; and (b) a computer-readable program that is stored on such medium. Such program is processable by an instruction execution apparatus (e.g., system or device) for causing the apparatus to perform various operations discussed hereinabove (e.g., discussed in connection with a block diagram). For example, in response to processing (e.g., executing) such program's instructions, the apparatus (e.g., programmable information handling system) performs various operations discussed hereinabove. Accordingly, such operations are computer-implemented.

Such program (e.g., software, firmware, and/or microcode) is written in one or more programming languages, such as: an object-oriented programming language (e.g., C++); a procedural programming language (e.g., C); and/or any suitable combination thereof. In a first example, the computer-readable medium is a computer-readable storage medium. In a second example, the computer-readable medium is a computer-readable signal medium.

A computer-readable storage medium includes any system, device and/or other non-transitory tangible apparatus (e.g., electronic, magnetic, optical, electromagnetic, infrared, semiconductor, and/or any suitable combination thereof) that is suitable for storing a program, so that such program is processable by an instruction execution apparatus for causing the apparatus to perform various operations discussed hereinabove. Examples of a computer-readable storage medium include, but are not limited to: an electrical connection having one or more wires; a portable computer diskette; a hard disk; a random access memory ("RAM"); a read-only memory ("ROM"); an erasable programmable read-only memory ("EPROM" or flash memory); an optical fiber; a portable compact disc read-only memory ("CD-ROM"); an optical storage device; a magnetic storage device; and/or any suitable combination thereof.

A computer-readable signal medium includes any computer-readable medium (other than a computer-readable storage medium) that is suitable for communicating (e.g., propagating or transmitting) a program, so that such program is processable by an instruction execution apparatus for causing the apparatus to perform various operations discussed hereinabove. In one example, a computer-readable signal medium includes a data signal having computer-readable program code embodied therein (e.g., in baseband or as part of a carrier wave), which is communicated (e.g., electronically, electromagnetically, and/or optically) via wireline, wireless, optical fiber cable, and/or any suitable combination thereof.

Although illustrative embodiments have been shown and described by way of example, a wide range of alternative embodiments is possible within the scope of the foregoing disclosure.

What is claimed is:

1. A method performed by at least one device for determining a power consumption of electrical circuitry, the method comprising:
   executing at least a portion of a software application having an effect on a current through the electrical circuitry;
   generating a current through a transistor for mirroring the current through the electrical circuitry;
   in response to a control word having a plurality of bits, generating a reference current using two or more current sources, wherein each of the two or more current sources is controlled in response to a respective one of the plurality of bits of the control word, wherein the reference current is separate from the current through the electrical circuitry and from the current through the transistor, and wherein a selected number of the two or more current sources is enabled in response to the control word; and
   in response to executing the portion of the software application, varying the control word to determine a value thereof that causes the reference current to approximately equal the current through the transistor as indicated by an output of a comparator that compares the reference current and the current through the transistor, wherein varying the control word includes changing a value of at least one of the bits of the control word;
   wherein the power consumption of the electrical circuitry in response to executing the portion of the software application is determined based at least partially upon the reference current when the control word is at the determined value.

2. The method of claim 1, wherein varying the control word includes:
   in response to executing the portion of the software application, comparing the reference current against the current through the transistor using the comparator, and outputting a signal in response thereto; and
   in response to the signal, varying the control word to determine the value thereof that causes the reference current to approximately equal the current through the transistor.

3. The method of claim 2, wherein the comparator includes a Schmitt trigger, and wherein comparing the reference current includes:
   with the Schmitt trigger, comparing the reference current against the current through the transistor, and outputting the signal from the Schmitt trigger in response thereto.

4. The method of claim 3, wherein varying the control word includes:
   in response to executing the portion of the software application, varying the control word to determine the value thereof that causes the Schmitt trigger to change the signal in response to the reference current approximately equaling the current through the transistor.

5. The method of claim 1, wherein varying the control word includes at least one of: systematically incrementing the control word; systematically decrementing the control word; and systematically iterating the control word.

6. The method of claim 1, wherein varying the control word includes:
   in response to executing at least one instruction of the portion of the software application, varying the control word to determine the value thereof that causes the reference current to approximately equal the current through the transistor, wherein the portion of the software application includes more than one instruction and the at least one instruction includes a last instruction of the portion of the software application.

7. The method of claim 1, and comprising:
   in response to the determined value of the control word, estimating the current through the electrical circuitry.

8. The method of claim 7, wherein the transistor is a first transistor, wherein the current through the electrical circuitry is a current through a second transistor, and wherein estimating the current through the electrical circuitry includes:
   in response to the determined value of the control word, estimating the current through the electrical circuitry as being approximately equal to the reference current multiplied by a channel width ratio between the first and second transistors.

9. The method of claim 8, wherein a capacitor is connected to a gate of the first transistor, and wherein generating the current through the first transistor includes:
closing a switch for connecting the gate of the first transistor to a gate of the second transistor during a time period that is sufficiently long for charging the capacitor to a voltage level of the gate of the second transistor.

10. The method of claim 1, wherein the two or more current sources comprise two or more binary-weighted current sources, and wherein generating the reference current includes:
generating the reference current by enabling the selected number of the two or more binary-weighted current sources in response to the control word.

11. A system for determining a power consumption of electrical circuitry, the system comprising:
at least one device for:
executing at least a portion of a software application having an effect on a current through the electrical circuitry;
generating a current through a transistor for mirroring the current through the electrical circuitry;
in response to a control word having a plurality of bits, generating a reference current using two or more current sources, wherein each of the two or more current sources is controlled in response to a respective one of the plurality of bits of the control word, wherein the reference current is separate from the current through the electrical circuitry and from the current through the transistor, and wherein a selected number of the two or more current sources is enabled in response to the control word; and
in response to executing the portion of the software application, varying the control word to determine a value thereof that causes the reference current to approximately equal the current through the transistor as indicated by an output of a comparator that compares the reference current and the current through the transistor wherein varying the control word includes changing a value of at least one of the bits of the control word
wherein the power consumption of the electrical circuitry in response to executing the portion of the software application is determined based at least partially upon the reference current when the control word is at the determined value.

12. The system of claim 11, wherein varying the control word includes:
in response to executing the portion of the software application, comparing the reference current against the current through the transistor using the comparator, and outputting a signal in response thereto; and
in response to the signal, varying the control word to determine the value thereof that causes the reference current to approximately equal the current through the transistor.

13. The system of claim 12, wherein the comparator includes a Schmitt trigger, and wherein comparing the reference current includes:
with the Schmitt trigger, comparing the reference current against the current through the transistor, and outputting the signal from the Schmitt trigger in response thereto.

14. The system of claim 13, wherein varying the control word includes:
in response to executing the portion of the software application, varying the control word to determine the value thereof that causes the Schmitt trigger to change the signal in response to the reference current approximately equaling the current through the transistor.

15. The system of claim 11, wherein varying the control word includes at least one of: systematically incrementing the control word; systematically decrementing the control word; and systematically iterating the control word.

16. The system of claim 11, wherein varying the control word includes:
in response to executing at least one instruction of the portion of the software application, varying the control word to determine the value thereof that causes the reference current to approximately equal the current through the transistor, wherein the portion of the software application includes more than one instruction and the at least one instruction includes a last instruction of the portion of the software application.

17. The system of claim 11, wherein the device is for:
in response to the determined value of the control word, estimating the current through the electrical circuitry.

18. The system of claim 17, wherein the transistor is a first transistor, wherein the current through the electrical circuitry is a current through a second transistor, and wherein estimating the current through the electrical circuitry includes:
in response to the determined value of the control word, estimating the current through the electrical circuitry as being approximately equal to the reference current multiplied by a channel width ratio between the first and second transistors.

19. The system of claim 18, wherein a capacitor is connected to a gate of the first transistor, and wherein generating the current through the first transistor includes:
closing a switch for connecting the gate of the first transistor to a gate of the second transistor during a time period that is sufficiently long for charging the capacitor to a voltage level of the gate of the second transistor.

20. The system of claim 11, wherein the two or more current sources comprise two or more binary-weighted current sources, and wherein generating the reference current includes:
generating the reference current by enabling the selected number of the two or more binary-weighted current sources in response to the control word.

21. A system for determining a power consumption of electrical circuitry, the system comprising:
at least one device for:
executing at least a portion of a software application having an effect on a current through the electrical circuitry;
generating a current through a transistor for mirroring the current through the electrical circuitry;
generating a reference current by enabling two or more binary-weighted current sources in response to a control word having a plurality of bits, wherein each of the two or more binary-weighted current sources is controlled in response to a respective one of the plurality of bits of the control word, the reference current is separate from the current through the electrical circuitry and from the current through the transistor, and a selected number of the two or more binary-weighted current sources is enabled in response to the control word; and in response to executing at least one instruction of the portion of the software application, varying the control word to determine a value thereof that causes the reference current to approximately equal the current through the transistor as indicated by an output of a comparator that compares the reference current and the current through the transistor, wherein the at least one instruction includes a last instruction of the portion of the software application, wherein varying the control word includes changing a value of at least one of the bits of the control word, and wherein the power consumption of the electrical circuitry in response to executing the at least one instruction is determined based at least partially upon the reference current when the control word is at the determined value.

22. The system of claim 21, wherein the comparator comprises a Schmitt trigger, and wherein varying the control word includes:
  in response to executing the at least one instruction of the portion of the software application, comparing with the Schmitt trigger the reference current against the current through the transistor, and outputting a signal from the Schmitt trigger in response thereto; and
  in response to the signal, varying the control word to determine the value thereof that causes the Schmitt trigger to change the signal in response to the reference current approximately equaling the current through the transistor.

23. The system of claim 22, wherein varying the control word includes systematically incrementing the control word.

24. The system of claim 22, wherein varying the control word includes systematically decrementing the control word.

25. The system of claim 22, wherein varying the control word includes systematically iterating the control word.

26. The system of claim 21, wherein the device is for:
  in response to the determined value of the control word, estimating the current through the electrical circuitry.

27. The system of claim 26, wherein the transistor is a first transistor, wherein the current through the electrical circuitry is a current through a second transistor, and wherein estimating the current through the electrical circuitry includes:
  in response to the determined value of the control word, estimating the current through the electrical circuitry as being approximately equal to the reference current multiplied by a channel width ratio between the first and second transistors.

28. The system of claim 27, wherein a capacitor is connected to a gate of the first transistor, and wherein generating the current through the first transistor includes:
  closing a switch for connecting the gate of the first transistor to a gate of the second transistor during a time period that is sufficiently long for charging the capacitor to a voltage level of the gate of the second transistor.

\* \* \* \* \*